United States Patent
Iizuka et al.

(10) Patent No.: US 9,059,077 B2
(45) Date of Patent: Jun. 16, 2015

(54) CRYSTAL LAYERED STRUCTURE AND METHOD FOR MANUFACTURING SAME, AND SEMICONDUCTOR ELEMENT

(71) Applicants: TAMURA CORPORATION, Tokyo (JP); KOHA CO., LTD., Tokyo (JP)

(72) Inventors: Kazuyuki Iizuka, Tokyo (JP); Yoshikatsu Morishima, Tokyo (JP); Shinkuro Sato, Tokyo (JP)

(73) Assignees: TAMURA CORPORATION, Tokyo (JP); KOHA CO., LTD, Tokyo (JP)

( * ) Notice: Subject to any disclaimer, the term of this patent is extended or adjusted under 35 U.S.C. 154(b) by 0 days.

(21) Appl. No.: 14/351,535

(22) PCT Filed: Oct. 12, 2012

(86) PCT No.: PCT/JP2012/076517
§ 371 (c)(1),
(2) Date: Apr. 11, 2014

(87) PCT Pub. No.: WO2013/054916
PCT Pub. Date: Apr. 18, 2013

(65) Prior Publication Data
US 2014/0231830 A1    Aug. 21, 2014

(30) Foreign Application Priority Data

Oct. 13, 2011  (JP) ................. 2011-225629
Oct. 13, 2011  (JP) ................. 2011-225630
Oct. 13, 2011  (JP) ................. 2011-225631

(51) Int. Cl.
*H01L 21/00* (2006.01)
*H01L 29/00* (2006.01)
(Continued)

(52) U.S. Cl.
CPC ......... *H01L 29/2003* (2013.01); *H01L 21/0242* (2013.01); *H01L 21/02565* (2013.01);
(Continued)

(58) Field of Classification Search
CPC ............ H01L 21/0242; H01L 21/0254; H01L 21/02458; H01L 21/02565; H01L 29/2003; H01L 33/007; H01L 33/0066
See application file for complete search history.

(56) References Cited

U.S. PATENT DOCUMENTS 5,372,970 A * 12/1994 Kubo ..................... 117/105
6,320,209 B1 * 11/2001 Hata et al. ............... 257/190
(Continued)

FOREIGN PATENT DOCUMENTS

EP      1 367 657 A2    12/2003
JP      2004-56098 (A)   2/2004
(Continued)

OTHER PUBLICATIONS

International Search Report dated Dec. 25, 2012 in PCT/JP2012/076517 (English version).
(Continued)

*Primary Examiner* — Ida M Soward
(74) *Attorney, Agent, or Firm* — McGinn IP Law Group, PLLC

(57) ABSTRACT

Provided is a crystal layered structure having a low dislocation density on the upper surface of a nitride semiconductor layer on a $Ga_2O_3$ substrate, and a method for manufacturing the same. In one embodiment, there is provided a crystal layered structure including: a $Ga_2O_3$ substrate; a buffer layer comprising an $Al_xGa_yIn_zN$ ($0 \le x \le 1$, $0 \le y \le 1$, $0 \le z \le 1$, $x+y+z=1$) crystal on the $Ga_2O_3$ substrate; and a nitride semiconductor layer comprising an $Al_xGa_yIn_zN$ ($0 \le x \le 1$, $0 \le y \le 1$, $0 \le z \le 1$, $x+y+z=1$) crystal including oxygen as an impurity on the buffer layer. The oxygen concentration in a region having a thickness of no less than 200 nm on the nitride semiconductor layer on the side towards the $Ga_2O_3$ substrate is no less than $1.0 \times 10^{18}/cm^3$.

28 Claims, 13 Drawing Sheets

(51) Int. Cl.
*H01L 33/00* (2010.01)
*H01L 29/20* (2006.01)
*H01L 33/32* (2010.01)
*H01L 33/12* (2010.01)
*C30B 25/16* (2006.01)
*C30B 29/40* (2006.01)
*C30B 25/10* (2006.01)
*C30B 25/18* (2006.01)
*H01L 21/02* (2006.01)

(52) U.S. Cl.
CPC ............. *H01L33/007* (2013.01); *H01L 33/32* (2013.01); *H01L 33/0066* (2013.01); *H01L 33/12* (2013.01); *H01L 21/02414* (2013.01); *H01L 21/02458* (2013.01); *H01L 21/02494* (2013.01); *H01L 21/0254* (2013.01); *H01L 21/02573* (2013.01); *H01L 21/0262* (2013.01); *C30B 25/16* (2013.01); *C30B 29/403* (2013.01); *C30B 25/10* (2013.01); *C30B 25/183* (2013.01); *H01L 21/02502* (2013.01)

(56) References Cited

U.S. PATENT DOCUMENTS

| | | | |
|---|---|---|---|
| 6,724,018 B2* | 4/2004 | Ando et al. | 257/186 |
| 8,058,639 B2* | 11/2011 | Inoue et al. | 257/13 |
| 8,110,851 B2* | 2/2012 | Yokogawa et al. | 257/103 |
| 2004/0007708 A1 | 1/2004 | Ichinose et al. | |
| 2006/0223287 A1 | 10/2006 | Ushida et al. | |
| 2007/0091953 A1* | 4/2007 | Ledentsov et al. | 372/43.01 |
| 2008/0217645 A1 | 9/2008 | Saxler et al. | |
| 2010/0295039 A1* | 11/2010 | Horio et al. | 257/43 |
| 2012/0070929 A1 | 3/2012 | Hashimoto et al. | |
| 2012/0242943 A1* | 9/2012 | Sun et al. | 349/144 |
| 2013/0126901 A1* | 5/2013 | Isozaki et al. | 257/76 |

FOREIGN PATENT DOCUMENTS

| | | |
|---|---|---|
| JP | 2006-310765 (A) | 11/2006 |
| JP | 2009-016505 A | 1/2009 |
| JP | 2009-227480 (A) | 10/2009 |
| JP | 2010-263007 A | 11/2010 |
| JP | 2011-103472 A | 5/2011 |

OTHER PUBLICATIONS

European Search Report dated Dec. 17, 2014.
Xie Zi-Li, et al. "Demonstration of GaN/InGaN Light Emitting Diodes on (100) β-$Ga_2O_3$ Substrates by Metalorganic Chemical Vapour Deposition" Chinese Physics Letters, vol. 25, No. 6 (Jun. 1, 2008), pp. 2185-2186.
Krysztof Kachel, et al. "A new approach to free-standing GaN using β-$Ga_2O_3$ as a substrate" CrystEngComm, pp. 8536-8540, Jan. 1, 2012, vol. 14.
Japanese Office Action dated Mar. 24, 2015 with a partial English translation thereof.
Tsung-Yen Tsai et al., "MOCVD Growth of GaN on Sapphire Using a $Ga_2O_3$ Interlayer," Journal of The Electrochemical Society, Oct. 5, 2011, vol. 158, No. 11, pp. H1172-H1178.
Christof Mauder et al., "Mechanisms of impurity incorporation during MOVPE growth of m-plane GaN layers on $LiAlO_2$," Physica Status Solodic, May 17, 2011, vol. 8, No. 7-8, pp. 2050-2052.

\* cited by examiner

CRYSTAL LAYERED STRUCTURE AND METHOD FOR MANUFACTURING SAME, AND SEMICONDUCTOR ELEMENT

TECHNICAL FIELD

The invention relates to a crystal layered structure (or laminated crystal structure) and a method for manufacturing the crystal layered structure (or laminated crystal structure), and a semiconductor element.

BACKGROUND ART

An LED element is known that includes a crystal layered structure composed of a $Ga_2O_3$ substrate, an AlN buffer layer and a GaN layer (see e.g. PTL 1). In PTL 1, the GaN layer is formed by growing a GaN crystal on the AlN buffer layer under the temperature condition of 1050° C.

In addition, in PTL 1, the AlN buffer layer is formed on the $Ga_2O_3$ substrate so as to completely cover the upper surface of the $Ga_2O_3$ substrate, and the GaN layer is formed on the AlN buffer layer. The crystal quality of the GaN layer can be improved by forming the AlN buffer layer.

Also, the manufacturing process of the semiconductor element disclosed in PTL 1 is conducted such that a surface of the $Ga_2O_3$ substrate is subjected to a nitriding treatment before forming the AlN buffer layer to grow the GaN crystal on the $Ga_2O_3$ substrate.

CITATION LIST

Patent Literature

[PTL 1]
JP-A-2006-310765

SUMMARY OF INVENTION

Technical Problem

However, in the method disclosed in PTL 1, the oxygen concentration in the GaN layer decreases since the GaN crystal is grown under the high temperature condition of 1050° C. Therefore, the dislocation density on the upper surface of the GaN layer (a surface opposite to the AlN buffer layer) increases and this causes a leakage current to occur in a low voltage region when voltage is applied in the vertical direction to the element which includes the crystal layered structure.

Also, there is a problem that the semiconductor element disclosed in PTL 1 does not operate at a low voltage due to the high electrical resistance between the $Ga_2O_3$ substrate and the GaN layer on the AlN buffer layer.

Also, since the electrical resistance increases at the nitrided portion of the $Ga_2O_3$ substrate, the semiconductor element disclosed in PTL 1 has a high electrical resistance between the $Ga_2O_3$ substrate and the nitride semiconductor layer and does not operate at a low voltage.

It is an object of the invention to provide a crystal layered structure that has a low dislocation density on the upper surface of a nitride semiconductor layer on a $Ga_2O_3$ substrate, as well as a method for manufacturing the crystal layered structure.

It is another object of the invention to provide a crystal layered structure that has a low electrical resistance between the $Ga_2O_3$ substrate and the nitride semiconductor layer, as well as a method for manufacturing the crystal layered structure and a semiconductor element including the crystal layered structure and driven at low voltage.

It is another object of the invention to provide a method for manufacturing a crystal layered structure that has a low electrical resistance between the $Ga_2O_3$ substrate and the nitride semiconductor layer.

Solution to Problem

According to one embodiment of the invention, a crystal layered structure as defined in [1] to [6] below and a method for manufacturing a crystal layered structure as defined in [7] to [10] below are provided so as to achieve one of the above objects.

[1] A crystal layered structure, comprising:
  a $Ga_2O_3$ substrate;
  a buffer layer comprising an $Al_xGa_yIn_zN$ ($0 \leq x \leq 1$, $0 \leq y \leq 1$, $0 \leq z \leq 1$, $x+y+z=1$) crystal on the $Ga_2O_3$ substrate; and
  a nitride semiconductor layer comprising an $Al_xGa_yIn_zN$ ($0 \leq x \leq 1$, $0 \leq y \leq 1$, $0 \leq z \leq 1$, $x+y+z=1$) crystal containing oxygen as an impurity on the buffer layer,
  wherein an oxygen concentration in a region on a side of the $Ga_2O_3$ substrate of the nitride semiconductor layer, region having a thickness of not less than 200 nm, is not less than $1.0 \times 10^{18}/cm^3$.

[2] The crystal layered structure according to [1], wherein the nitride semiconductor layer has a dislocation density of less than $1.0 \times 10^9/cm^2$ on a surface thereof opposite the $Ga_2O_3$ substrate.

[3] The crystal layered structure according to [1] or [2], wherein an oxygen concentration in a region on the side of the $Ga_2O_3$ substrate of the nitride semiconductor layer, the region having a thickness of not less than 500 nm, is not less than $1.0 \times 10^{18}/cm^3$.

[4] The crystal layered structure according to [1] or [2], wherein the oxygen concentration in the region is not less than $5.0 \times 10^{18}/cm^3$.

[5] The crystal layered structure according to [1] or [2], wherein the $Al_xGa_yIn_zN$ crystal of the buffer layer comprises an AlN crystal.

[6] The crystal layered structure according to [1] or [2], wherein the $Al_xGa_yIn_zN$ crystal of the nitride semiconductor layer comprises a GaN crystal.

[7] A method for manufacturing a crystal layered structure, comprising:
  a step of forming a buffer layer by growing a first $Al_xGa_yIn_zN$ ($0 \leq x \leq 1$, $0 \leq y \leq 1$, $0 \leq z \leq 1$, $x+y+z=1$) crystal on a $Ga_2O_3$ substrate; and
  a step of forming a nitride semiconductor layer by growing a second $Al_xGa_yIn_zN$ ($0 \leq x \leq 1$, $0 \leq y \leq 1$, $0 \leq z \leq 1$, $x+y+z=1$) crystal on the buffer layer,
  wherein the second $Al_xGa_yIn_zN$ crystal is initially grown at a first temperature of not more than 1000° C. and is then grown at a second temperature higher than the first temperature in the step of forming the nitride semiconductor layer, and
  wherein the second $Al_xGa_yIn_zN$ crystal grown at the first temperature is not less than 200 nm in thickness.

[8] The method for manufacturing a crystal layered structure according to [7], wherein the second $Al_xGa_yIn_zN$ crystal grown at the first temperature is not less than 500 nm in thickness.

[9] The method for manufacturing a crystal layered structure according to [7] or [8], wherein the first $Al_xGa_yIn_zN$ crystal comprises an AlN crystal.

[10] The method for manufacturing a crystal layered structure according to [7] or [8], wherein the second $Al_xGa_yIn_zN$ crystal comprises a GaN crystal.

According to one embodiment of the invention, a crystal layered structure as defined in [11] to [16] below, a semiconductor element as defined in [17] and a method for manufacturing a crystal layered structure as defined in [18] to [23] below are provided so as to achieve one of the above objects.

[11] A crystal layered structure, comprising:
a $Ga_2O_3$ substrate;
a buffer layer comprising an $Al_xGa_yIn_zN$ (0≤x≤1, 0≤y≤1, 0≤z≤1, x+y+z=1) crystal on the $Ga_2O_3$ substrate; and
a nitride semiconductor layer comprising an $Al_xGa_yIn_zN$ (0≤x≤1, 0≤y≤1, 0≤z≤1, x+y+z=1) crystal on the buffer layer,
wherein a percentage of a surface of the $Ga_2O_3$ substrate covered with the buffer layer in a region immediately below the nitride semiconductor layer is not less than 10% and less than 100%, and
wherein a portion of the nitride semiconductor layer is in contact with the surface of the $Ga_2O_3$ substrate.

[12] The crystal layered structure according to [11], wherein the percentage is not more than 90%.

[13] The crystal layered structure according to [11] or [12], wherein the buffer layer comprises the $Al_xGa_yIn_zN$ crystal arranged in an island pattern on the $Ga_2O_3$ substrate.

[14] The crystal layered structure according to [11] or [12], wherein the buffer layer comprises the $Al_xGa_yIn_zN$ crystal in a film shape comprising a hole.

[15] The crystal layered structure according to [11] or [12], wherein the $Al_xGa_yIn_zN$ crystal of the buffer layer comprises an AlN crystal.

[16] The crystal layered structure according to [11] or [12], wherein the $Al_xGa_yIn_zN$ crystal of the nitride semiconductor layer comprises a GaN crystal.

[17] A semiconductor element, comprising:
the crystal layered structure according to [11] or [12],
wherein the $Ga_2O_3$ substrate and the nitride semiconductor layer are configured to allow electrical conduction therethrough.

[18] A method for manufacturing a crystal layered structure, comprising:
a step of forming a buffer layer by growing a first $Al_xGa_yIn_zN$ (0≤x≤1, 0≤y≤1, 0≤z≤1, x+y+z=1) crystal on a $Ga_2O_3$ substrate so as to partially cover a surface of the $Ga_2O_3$ substrate; and
a step of forming a nitride semiconductor layer by growing a second $Al_xGa_yIn_zN$ (0≤y≤1, 0≤z≤1, x+y+z=1) crystal on the buffer layer,
wherein a percentage of a surface of the $Ga_2O_3$ substrate covered with the buffer layer in a region immediately below the nitride semiconductor layer is not less than 10% and less than 100%, and
wherein a portion of the nitride semiconductor layer is in contact with the surface of the $Ga_2O_3$ substrate.

[19] The method for manufacturing a crystal layered structure according to [18], wherein the percentage is not more than 90%.

[20] The method for manufacturing a crystal layered structure according to [18] or [19], wherein the buffer layer is formed by growing the first $Al_xGa_yIn_zN$ crystal in an island pattern on the $Ga_2O_3$ substrate.

[21] The method for manufacturing a crystal layered structure according to [18] or [19], wherein the buffer layer is formed by growing the first $Al_xGa_yIn_zN$ crystal in a film shape comprising a hole on the $Ga_2O_3$ substrate.

[22] The method for manufacturing a crystal layered structure according to [18] or [19], wherein the first $Al_xGa_yIn_zN$ crystal comprises an AlN crystal.

[23] The method for manufacturing a crystal layered structure according to [18] or [19], wherein the second $Al_xGa_yIn_zN$ crystal comprises a GaN crystal.

According to one embodiment of the invention, a method for manufacturing a crystal layered structure as defined in [24] to [28] below is provided so as to achieve one of the above objects.

[24] A method for manufacturing a crystal layered structure, comprising:
a step of forming a buffer layer by growing a first $Al_xGa_yIn_zN$ (0≤x≤1, 0≤y≤1, 0≤z≤1, x+y+z=1) crystal at a first temperature on a $Ga_2O_3$ substrate of which principal surface is a surface having an oxygen atom arranged in a hexagonal lattice pattern; and
a step of forming a nitride semiconductor layer by growing a second $Al_xGa_yIn_zN$ (0≤x≤1, 0≤y≤1, 0≤z≤1, x+y+z=1) crystal on the buffer layer,
wherein a step of nitriding a surface of the $Ga_2O_3$ substrate at a higher temperature than the first temperature is not performed before forming the buffer layer.

[25] The method for manufacturing a crystal layered structure according to [24], wherein the $Ga_2O_3$ substrate is kept at the first temperature for not more than 10 minutes in a state of being exposed to a nitrogen raw material gas and is then kept at the first temperature in a state of being exposed to the N-raw material gas and an Al raw material gas to grow the second $Al_xGa_yIn_zN$ crystal.

[26] The method for manufacturing a crystal layered structure according to [24] or [25], wherein the principal surface of the $Ga_2O_3$ substrate comprises one of (101), (−201), (301) and (3-10) planes.

[27] The method for manufacturing a crystal layered structure according to [24] or [25], wherein the first $Al_xGa_yIn_zN$ crystal comprises an AlN crystal.

[28] The method for manufacturing a crystal layered structure according to [24] or [25], wherein the second $Al_xGa_yIn_zN$ crystal comprises a GaN crystal.

Advantageous Effects of Invention

According to one embodiment of the invention, a crystal layered structure can be provided that has a low dislocation density on the upper surface of a nitride semiconductor layer on a $Ga_2O_3$ substrate, as well as a method for manufacturing the crystal layered structure.

According to one embodiment of the invention, a crystal layered structure can be provided that has a low electrical resistance between the $Ga_2O_3$ substrate and the nitride semiconductor layer, as well as a method for manufacturing the crystal layered structure and a semiconductor element including the crystal layered structure and driven at low voltage.

According to one embodiment of the invention, a method for manufacturing a crystal layered structure can be provided that has a low electrical resistance between the $Ga_2O_3$ substrate and the nitride semiconductor layer.

BRIEF DESCRIPTION OF DRAWINGS

FIG. 1 is a cross sectional view showing a crystal layered structure in a first embodiment.

FIG. 2 is a graph showing an example manufacturing process sequence of the crystal layered structure in the first embodiment.

FIG. 3 is a graph of Example 1 showing a relation between a thickness of a high oxygen concentration layer and dislocation density on an upper surface of a nitride semiconductor layer and a relation between an oxygen concentration in the high oxygen concentration layer and the dislocation density on the upper surface of the nitride semiconductor layer.

FIG. 4 is a cross sectional view showing an LED element in Example 2.

FIG. 5 is a cross sectional view showing a crystal layered structure in a second embodiment.

FIG. 6 is a cross sectional view showing an LED element in a third embodiment.

FIG. 7A is a SEM image of a buffer layer in Example 3.

FIG. 7B is a SEM image of a buffer layer in Example 3.

FIG. 8 is a graph of Example 3 showing a relation between the supply quantity of Al raw material to a chamber of a MOCVD system and the coverage rate of an AlN crystal layer as the buffer layer.

FIG. 9 is a graph of Example 3 showing a relation between the coverage rate of an AlN crystal layer as the buffer layer and voltage between a $Ga_2O_3$ substrate and a GaN crystal layer as a nitride semiconductor layer when a current of a predetermined magnitude flows.

FIG. 10 is a cross sectional view showing a crystal layered structure in a fourth embodiment.

FIG. 11 is a graph showing an example manufacturing process sequence of the crystal layered structure in the fourth embodiment.

FIG. 12 is a graph showing an example manufacturing process sequence of a crystal layered structure in Comparative Example.

FIG. 13 shows measured values of voltage between the $Ga_2O_3$ substrate and the nitride semiconductor layer when a current of a predetermined magnitude flows through a crystal layered structure in Example 5.

DESCRIPTION OF EMBODIMENTS

[First Embodiment]
(Configuration of Crystal Layered Structure)

Figure 1:
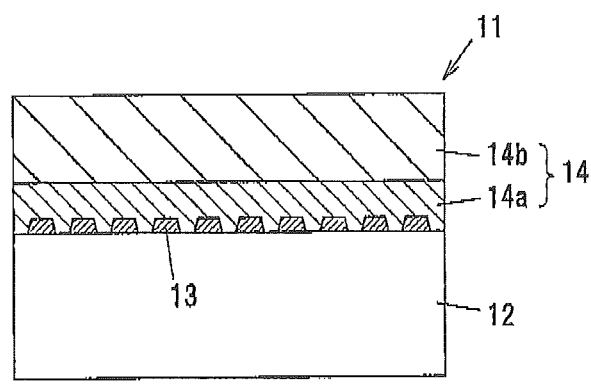
[FIG. 1]

FIG. 1 is a cross sectional view showing a crystal layered structure 11 in the first embodiment. The crystal layered structure 11 includes a $Ga_2O_3$ substrate 12, a buffer layer 13 on the $Ga_2O_3$ substrate 12 and a nitride semiconductor layer 14 on the buffer layer 13.

The $Ga_2O_3$ substrate 12 is formed of a β-$Ga_2O_3$ single crystal.

The buffer layer 13 is formed of an $Al_xGa_yIn_zN$ (0≤x≤1, 0≤y≤1, 0≤z≤1, x+y+z=1) crystal. In addition, the coverage rate of the buffer layer 13 on the upper surface of the $Ga_2O_3$ substrate 12 is preferably 10 to 90% in order to successfully form a high oxygen concentration layer 14a of the nitride semiconductor layer 14 described later, and the buffer layer 13 is formed in, e.g., an island pattern as shown in FIG. 1.

In addition, among the $Al_xGa_yIn_zN$ crystals, an AlN crystal (x=1, y=z=0) is especially preferable to form the buffer layer 13. When the buffer layer 13 is formed of an AlN crystal, adhesion between the $Ga_2O_3$ substrate 12 and the nitride semiconductor layer 14 is further increased.

The nitride semiconductor layer 14 includes a high oxygen concentration layer 14a in contact with the buffer layer 13 and a low oxygen concentration layer 14b on the high oxygen concentration layer 14a. The nitride semiconductor layer 14 the high oxygen concentration layer 14a and the low oxygen concentration layer 14b) is formed of an $Al_xGa_yIn_zN$ (0≤x≤1, 0≤y≤1, 0≤z≤1, x+y+z=1) crystal containing oxygen as an impurity and is preferably formed of especially a GaN crystal (y=1, x=z=0) having good crystal quality. The thickness of the nitride semiconductor layer 14 is, e.g., 3 μm.

On the upper surface of the nitride semiconductor layer 14 (a surface opposite to the $Ga_2O_3$ substrate 12), i.e., on the upper surface of the low oxygen concentration layer 14b, dislocation density is low and occurrence of leakage current in a low voltage region is thus suppressed when voltage is applied in the vertical direction to an element including the crystal layered structure 11. The leakage current can be suppressed to a practicable level especially when the dislocation density on the upper surface of the low oxygen concentration layer 14b is less than $1.0\times10^9/cm^2$.

The oxygen concentration in the high oxygen concentration layer 14a is higher than that in the low oxygen concentration layer 14b and is not less than $1.0\times10^{18}/cm^3$. In addition, the thickness of the high oxygen concentration layer 14a is not less than 200 nm. The dislocation density on the upper surface of the nitride semiconductor layer 14 is reduced by providing the high oxygen concentration layer 14a.

In addition, in order to further reduce the dislocation density on the upper surface of the nitride semiconductor layer 14, the oxygen concentration in the high oxygen concentration layer 14a is preferably not less than $5.0\times10^{18}/cm^3$ and the thickness of the high oxygen concentration layer 14a is preferably not less than 500 nm.

It should be noted that in order to prevent pits (holes) from being formed on a surface of the nitride semiconductor layer 14, a semiconductor crystal to be finally formed needs to be grown at high temperature and the low oxygen concentration layer 14b having a relatively low oxygen concentration is thus formed.

The $Ga_2O_3$ substrate 12 and the nitride semiconductor layer 14 (the high oxygen concentration layer 14a and the low oxygen concentration layer 14b) may contain a conductive impurity such as Si.

(Method for Manufacturing Crystal Layered Structure)

Figure 2:
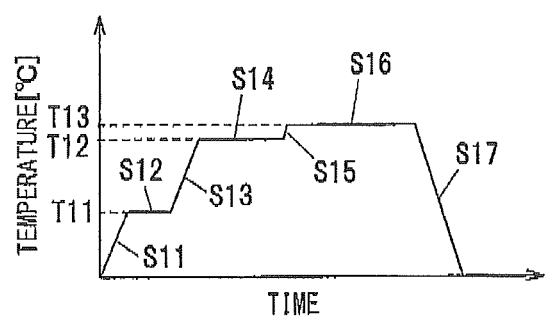
[FIG. 2]

FIG. 2 is a graph showing an example manufacturing process of the crystal layered structure in the present embodiment. A polygonal line in FIG. 2 indicates variation in temperature condition over time.

Firstly, the $Ga_2O_3$ substrate 12 is subjected to pretreatment for 120 minutes using phosphoric acid of 98 wt % concentration heated to 150° C. A surface of the $Ga_2O_3$ substrate 12 is etched about 1000 nm in the pretreatment.

Next, the $Ga_2O_3$ substrate 12 is delivered to a chamber of a MOCVD (Metal Organic Chemical Vapor Deposition) system and temperature in the chamber is then increased to T11 (Step S11). Here, T11 is from 350 to 600° C., e.g., 450° C.

Next, $NH_3$ gas as an N raw material, trimethylgallium (TMG) as a Ga raw material, trimethyl aluminum (TMA) as an Al raw material and trimethylindium (TMI) as an In raw material are fed to the chamber while keeping the temperature in the chamber at T11 to grow an $Al_xGa_yIn_zN$ crystal on the $Ga_2O_3$ substrate 12, thereby forming the buffer layer 13 (Step S12).

Next, the temperature in the chamber is increased to T12 (Step S13). Here, T12 is not more than 1000° C., e.g., 950° C. If T12 is more than 1000° C., the oxygen concentration in the high oxygen concentration layer 14a is highly likely to decrease.

Next, $NH_3$, TMG, TMA and TMI are fed to the chamber while keeping the temperature in the chamber at T12 to grow an $Al_xGa_yIn_zN$ crystal on the buffer layer 13, thereby forming the high oxygen concentration layer 14a of the nitride semiconductor layer 14 (Step S14).

Next, the temperature in the chamber is increased to T13 while continuously feeding each raw material gas (Step S15). Here, T13 is higher than T12 and is preferably higher than 1000° C., e.g., 1050° C.

Next, the $Al_xGa_yIn_zN$ crystal is continuously grown while keeping the temperature in the chamber at T13, thereby forming the low oxygen concentration layer 14b of the nitride semiconductor layer 14 (Step S16). As a result, the crystal layered structure 11 is obtained.

After that, the temperature in the chamber is reduced (Step S17) and the crystal layered structure 11 is taken out from the chamber.

(Effects of the First Embodiment)

In the first embodiment, by providing a high oxygen concentration region in the nitride semiconductor layer on the $Ga_2O_3$ substrate side, it is possible to form a crystal layered structure in which dislocation density on the upper surface of the nitride semiconductor layer is low. Therefore, occurrence of leakage current in a low voltage region can be suppressed in case that an element such as LED element is formed using such a crystal layered structure.

EXAMPLE 1

In Example 1, a relation between the thickness of the high oxygen concentration layer 14a and the dislocation density on the upper surface of the nitride semiconductor layer 14 and a relation between the oxygen concentration in the high oxygen concentration layer 14a and the dislocation density on the upper surface of the nitride semiconductor layer 14 in the crystal layered structure 11 in the first embodiment were evaluated.

Eleven crystal layered structures, in which respective high oxygen concentration layers corresponding to the high oxygen concentration layer 14a have different oxygen concentrations and thicknesses, were prepared and evaluated. Here, each high oxygen concentration layer has the oxygen concentration of $1.0 \times 10^{17}/cm^3$, $1.0 \times 10^{18}/cm^3$ or $5.0 \times 10^{18}/cm^3$ and the thickness of 100 nm, 200 nm, 500 nm or 1000 nm. Of those, the high oxygen concentration layers having the oxygen concentration of not less than $1.0 \times 10^{18}/cm^3$ as well as the thickness of not less than 200 nm correspond to the high oxygen concentration layer 14a in the first embodiment of the invention.

It should be noted that the high oxygen concentration layers having the oxygen concentration of $1.0 \times 10^{17}/cm^3$, $1.0 \times 10^{18}/cm^3$ and $5.0 \times 10^{18}/cm^3$ were respectively formed under the temperature condition of T12=1050° C., 1000° C. and 950° C.

It should be noted that in any of the crystal layered structures in the present Example, the buffer layer corresponding to the buffer layer 13 was a 5 nm-thick AlN crystal film formed under the temperature condition of T11=450° C., the low oxygen concentration layer corresponding to the low oxygen concentration layer 14b and the high oxygen concentration layer were GaN crystal films containing Si, the nitride semiconductor layer corresponding to the nitride semiconductor layer 14 had a thickness (the total of the thickness of the high oxygen concentration layer and the thickness of the low oxygen concentration layer) of 3 μm, and the low oxygen concentration layer was formed under the temperature condition of T13=1050° C.

Figure 3:
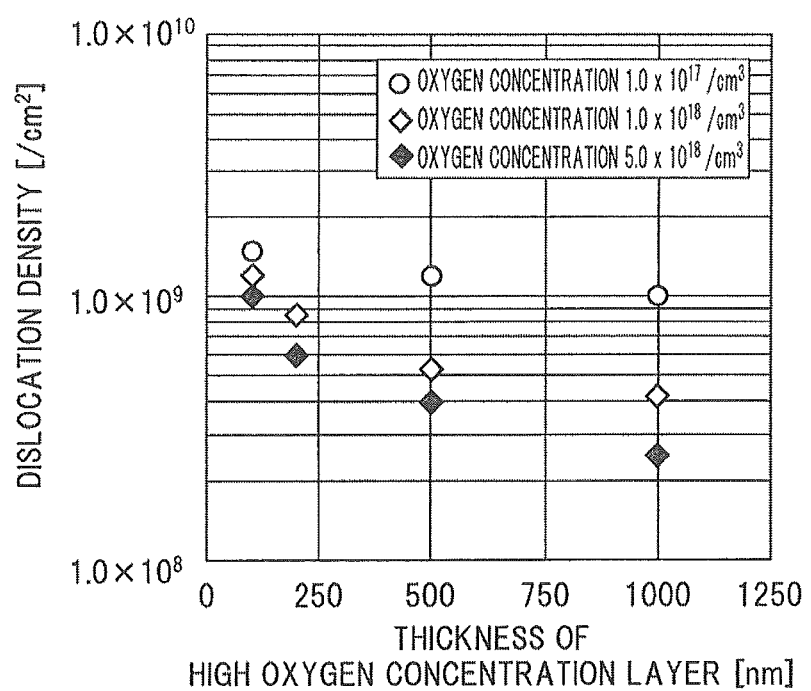
[FIG. 3]

FIG. 3 is a graph of Example 1 showing a relation between a thickness of the high oxygen concentration layer and dislocation density on the upper surface of the nitride semiconductor layer and a relation between an oxygen concentration in the high oxygen concentration layer and the dislocation density on the upper surface of the nitride semiconductor layer. In FIG. 3, the vertical axis indicates dislocation density [/cm²] on the upper surface of the nitride semiconductor layer and the horizontal axis indicates a thickness [nm] of the high oxygen concentration layer.

In FIG. 3, open circles indicate values measured on the crystal layered structures with a high oxygen concentration layer having the oxygen concentration of $1.0 \times 10^{17}/cm^3$, open diamonds indicate values measured on the crystal layered structures with a high oxygen concentration layer having the oxygen concentration of $1.0 \times 10^{18}/cm^3$ and filled diamonds indicate values measured on the crystal layered structures with a high oxygen concentration layer having the oxygen concentration of $5.0 \times 10^{18}/cm^3$.

As shown in FIG. 3, the higher the oxygen concentration in the high oxygen concentration layer, the lower the dislocation density on the upper surface of the nitride semiconductor layer. In addition, the thicker the high oxygen concentration layer, the lower the dislocation density on the upper surface of the nitride semiconductor layer. Especially when the high oxygen concentration layer has the oxygen concentration of not less than $1.0 \times 10^{18}/cm^3$ and the thickness of not less than 200 nm, i.e., when the high oxygen concentration layer corresponds to the high oxygen concentration layer 14a, the dislocation density on the upper surface of the nitride semiconductor layer is less than $1.0 \times 10^9/cm^2$ and it is possible to effectively suppress leakage current which occurs in a low voltage region when voltage is applied in the vertical direction to an element including such a crystal layered structure.

EXAMPLE 2

In Example 2, voltage was applied in the vertical direction to an LED element formed using the crystal layered structure 11 in the first embodiment and a level of leakage current in a low voltage region was evaluated.

(Configuration of LED Element)

Figure 4:
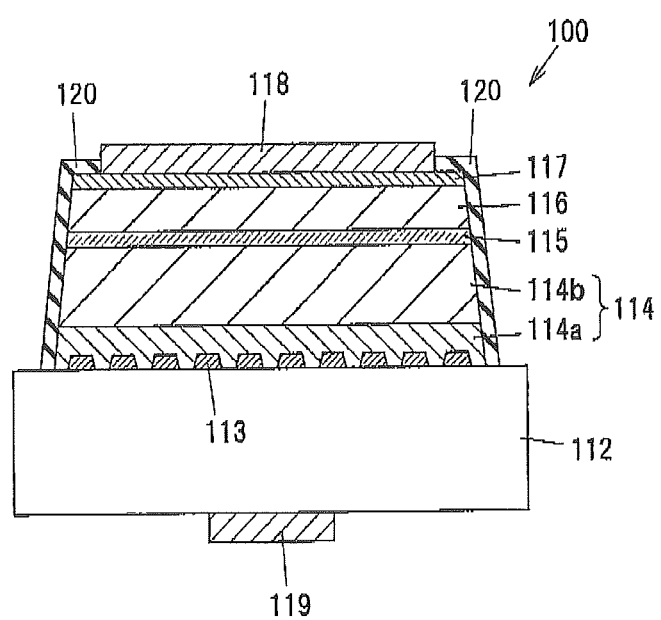
[FIG. 4]

FIG. 4 is a cross sectional view showing an LED element formed using the crystal layered structure in the first embodiment. An LED element 100 has a $Ga_2O_3$ substrate 112, a buffer layer 113 on the $Ga_2O_3$ substrate 112, an n-GaN layer 114 on the buffer layer 113, a light-emitting layer 115 on the n-GaN layer 114, a p-GaN layer 116 on the light-emitting layer 115, a contact layer 117 on the p-GaN layer 116, a p-type electrode 118 on the contact layer 119 and an n-type electrode 119 on a surface of the $Ga_2O_3$ substrate 112 opposite to the buffer layer 113.

The LED element 100 is a light-emitting element of which light extraction surface is located on the $Ga_2O_3$ substrate 112 side. A laminated body composed of the n-GaN layer 114, the light-emitting layer 115, the p-GaN layer 116 and the contact layer 117 has a mesa shape of which side surfaces are covered with an $SiO_2$ film 120.

Here, the $Ga_2O_3$ substrate 112, the buffer layer 113 and the nitride semiconductor layer 114 correspond to the $Ga_2O_3$ substrate 12, the buffer layer 13 and the n-GaN layer 14 in the first embodiment, and the laminated body composed of the $Ga_2O_3$ substrate 112, the buffer layer 113 and the n-GaN layer 114 corresponds to the crystal layered structure 11 in the first embodiment.

The n-GaN layer 114 includes a high oxygen concentration layer 114a and a low oxygen concentration layer 114b. The high oxygen concentration layer 114a and the low oxygen concentration layer 114b respectively correspond to the high oxygen concentration layer 14a and the low oxygen concentration layer 14b in the first embodiment.

The $Ga_2O_3$ substrate 112 is an n-type $\beta$-$Ga_2O_3$ substrate containing Si. In addition, the $Ga_2O_3$ substrate 112 is 400 μm in thickness and has a principal surface oriented in (101).

The buffer layer 113 is a 5 nm-thick AlN crystal film formed at a growth temperature of 450° C.

The high oxygen concentration layer 114a is an n-type GaN crystal film which contains Si and is formed at a growth temperature of 950° C. The high oxygen concentration layer 114a includes a 10 nm-thick lower region having a Si concentration of $2.0 \times 10^{19}/cm^3$ and a 1000 nm-thick upper region having a Si concentration of $5.0 \times 10/cm^3$. It should be noted that monomethylsilane gas is used as an Si raw material.

The low oxygen concentration layer 114b is a 3 μm-thick n-type GaN crystal film formed at a growth temperature of 1050° C. The low oxygen concentration layer 114b contains Si at a concentration of $1.0 \times 10^{18}/cm^3$.

The light-emitting layer 115 is composed of three layers of multiple quantum well structures formed at a growth temperature of 750° C. and a 10 nm-thick GaN crystal film thereon. Each multiple quantum well structure is composed of an 8 nm-thick GaN crystal film and a 2 nm-thick InGaN crystal film.

The p-GaN layer 116 is a 150 nm-thick p-type GaN crystal film formed at a growth temperature of 1000° C. The p-GaN layer 116 contains Mg at a concentration of $5.0 \times 10^{19}/cm^3$. It should be noted that cyclopentadienyl magnesium gas is used as an Mg raw material.

The contact layer 117 is a 10 nm-thick p-type GaN crystal film formed at a growth temperature of 1000° C. The contact layer 117 contains Mg at a concentration of $1.5 \times 10^{20}/cm^3$.

Meanwhile, an LED element in which a 3 μm-thick n-type GaN crystal film formed at a growth temperature of 1050° C. is used in place of the high oxygen concentration layer 114a was prepared as Comparative Example. This GaN crystal film contains Si at the same concentration as in the high oxygen concentration layer 114a of the LED element 100.

[Evaluation of LED Element]

The LED element 100 and the LED in Comparative Example were respectively mounted on can-type stems using Ag paste, and current values when voltage of 2.0V was applied between electrodes were measured.

As a result, the current value of the LED element 100 was 0.35 μA while the current value of the LED in Comparative Example was 20 μA. It was confirmed from this result that occurrence of leakage current in a low voltage region is suppressed in the LED element 100.

[Second Embodiment]

(Configuration of Crystal Layered Structure)

Figure 5:
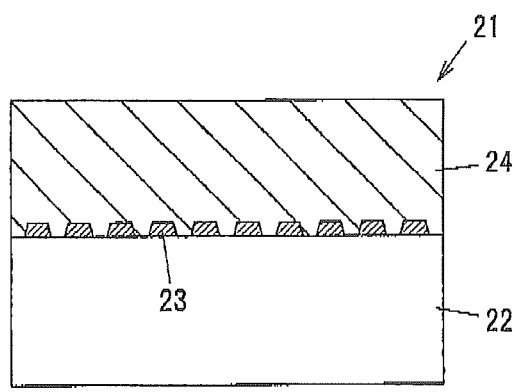
[FIG. 5]

FIG. 5 is a cross sectional view showing a crystal layered structure in the second embodiment. A crystal layered structure 21 includes a $Ga_2O_3$ substrate 22, a buffer layer 23 on the $Ga_2O_3$ substrate 22 and a nitride semiconductor layer 24 on the buffer layer 23.

The $Ga_2O_3$ substrate 22 is formed of a $\beta$-$Ga_2O_3$ single crystal.

The buffer layer 23 is formed of an $Al_xGa_yIn_zN$ ($0 \leq x \leq 1$, $0 \leq y \leq 1$, $0 \leq z \leq 1$, $x+y+z=1$) crystal. A percentage of the surface of the $Ga_2O_3$ substrate 22 covered with the buffer layer 23 in a region immediately below the nitride semiconductor layer 24 (hereinafter, also referred as "coverage rate of the buffer layer 23") is not less than 10% and less than 100%, and preferably, not less than 10% and not more than 90%. When the coverage rate is, e.g., 10%, the shape of the buffer layer 23 is an island pattern as shown in FIG. 5. Meanwhile, when the coverage rate is 90%, the buffer layer 23 has a film shape with holes.

When the coverage rate of the buffer layer 23 is less than 100%, the nitride semiconductor layer 24 is directly in contact with the surface of the $Ga_2O_3$ substrate 22 in a region not covered with the buffer layer 23 and electrical resistance between the $Ga_2O_3$ substrate 22 and the nitride semiconductor layer 24 is reduced. Electrical resistance between the $Ga_2O_3$ substrate 22 and the nitride semiconductor layer 24 drops especially when the coverage rate is not more than 90%.

On the other hand, when the coverage rate is lower than 10%, the buffer layer 23 does not serve as a buffer layer when forming the nitride semiconductor layer 24, which causes a decrease in crystal quality of the nitride semiconductor layer 24 and an increase in electrical resistance.

Among the $Al_xGa_yIn_zN$ crystals, an AlN crystal (x=1, y=z=0) is especially preferable to form the buffer layer 23. When the buffer layer 23 is formed of an AlN crystal, adhesion between the $Ga_2O_3$ substrate 22 and the nitride semiconductor layer 24 is further increased.

The nitride semiconductor layer 24 is formed of an $Al_xGa_yIn_zN$ ($0 \leq x \leq 1$, $0 \leq y \leq 1$, $0 \leq z \leq 1$, $x+y+z=1$) crystal and is preferably formed of especially a GaN crystal (y=1, x=z=0) having good crystal quality. The thickness of the nitride semiconductor layer 24 is, e.g., 5 μm.

It should be noted that the $Ga_2O_3$ substrate 22 and the nitride semiconductor layer 24 may contain a conductive impurity such as Si.

(Method for Manufacturing Crystal Layered Structure)

An example manufacturing process of the crystal layered structure in the present embodiment will be described below.

Firstly, the $Ga_2O_3$ substrate 22 is subjected to pretreatment for 120 minutes. A surface of the $Ga_2O_3$ substrate 22 is etched about 1000 nm in the pretreatment.

Next, the $Ga_2O_3$ substrate 22 is delivered to a chamber of a MOCVD (Metal Organic Chemical Vapor Deposition) system.

Next, $NH_3$ gas as an N raw material, trimethylgallium (TMG) gas as a Ga raw material, trimethyl aluminum (TMA) gas as an Al raw material and trimethylindium (TMI) gas as an In raw material are fed to the chamber while keeping the temperature in the chamber at 370 to 500° C. to grow an $Al_xGa_yIn_zN$ crystal on the $Ga_2O_3$ substrate 22, thereby forming the buffer layer 23. At this stage, the buffer layer 23 is a film having uniform thickness and covers 100% of the surface of the $Ga_2O_3$ substrate 22. It should be noted that raw materials of the respective elements are not limited to the above.

Next, the temperature in the chamber is increased to, e.g., 1000° C. Here, the buffer layer 23 undergoes a change on the $Ga_2O_3$ substrate 22 and is transformed into an island pattern or a perforated film once the temperature in the chamber reaches a predetermined temperature, e.g., 800° C. As a result, a percentage of the surface of the $Ga_2O_3$ substrate 22 covered with the buffer layer 23 becomes not less than 10% and less than 100%.

In this regard, however, the larger the supply quantities of raw materials of the group III elements (Al, Ga, In) and the group V element (N) at the time of forming the buffer layer 23, the higher the coverage rate of the buffer layer 23 after transformation. Therefore, the supply quantities of such raw materials need to be controlled so that the coverage rate is not 100%.

Next, $NH_3$ gas, TMG gas, TMA gas and TMI gas are fed to the chamber while keeping the temperature in the chamber at, e.g., 1000° C. to grow an $Al_xGa_yIn_zN$ crystal on the buffer layer 23, thereby forming the nitride semiconductor layer 24. As a result, the crystal layered structure 21 is obtained.

[Third Embodiment]

(Configuration of Semiconductor Element)

The third embodiment is a semiconductor element including the crystal layered structure 21 in the second embodiment. An LED element will be described below as an example of such a semiconductor element.

Figure 6:
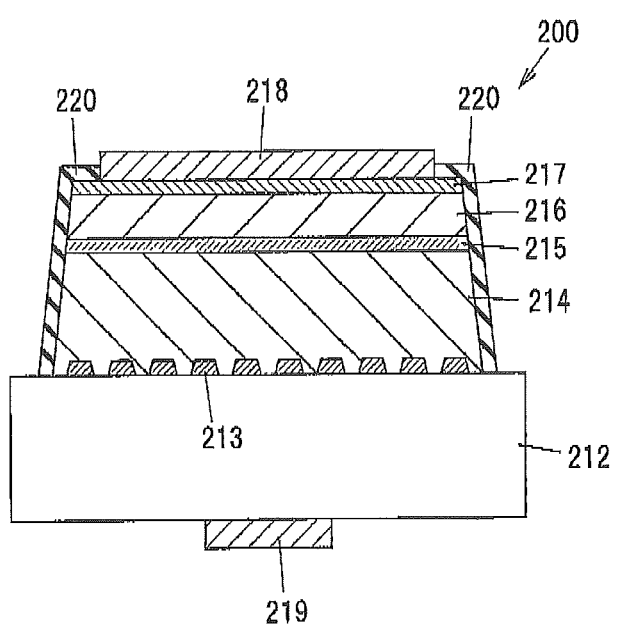
[FIG. 6]

FIG. 6 is a cross sectional view showing an LED element in the third embodiment. An LED element 200 has a $Ga_2O_3$ substrate 212, a buffer layer 213 on the $Ga_2O_3$ substrate 212, a nitride semiconductor layer 214 on the buffer layer 213, a light-emitting layer 215 on the nitride semiconductor layer 214, a p-GaN layer 216 on the light-emitting layer 215, a contact layer 217 on the p-GaN layer 216, a p-type electrode 218 on the contact layer 217 and an n-type electrode 219 on a surface of the $Ga_2O_3$ substrate 212 opposite to the buffer layer 213.

The LED element 200 is a light-emitting element of which light extraction surface is located on the $Ga_2O_3$ substrate 212 side. A laminated body composed of the nitride semiconductor layer 214, the light-emitting layer 215, the p-GaN layer 216 and the contact layer 217 has a mesa shape of which side surfaces are covered with an $SiO_2$ film 220.

Here, the $Ga_2O_3$ substrate 212, the buffer layer 213 and the nitride semiconductor layer 214 correspond to the $Ga_2O_3$ substrate 22, the buffer layer 23 and the nitride semiconductor layer 24 in the second embodiment, and the laminated body composed of the $Ga_2O_3$ substrate 212, the buffer layer 213 and the nitride semiconductor layer 214 corresponds to the crystal layered structure 21 in the second embodiment.

The LED element 200 is a vertical-type semiconductor element in which electricity is conducted to the $Ga_2O_3$ substrate 212 and the nitride semiconductor layer 214 during operation. The $Ga_2O_3$ substrate 212 and the nitride semiconductor layer 214 are directly in contact with each other and electrical resistance therebetween is low. Therefore, the LED element 200 can operate at low voltage.

The $Ga_2O_3$ substrate 212 is an n-type β-$Ga_2O_3$ substrate. The $Ga_2O_3$ substrate 212 is, e.g., 400 µm in thickness and has a principal surface oriented in (101).

The buffer layer 213 is, e.g., a 5 µm-thick n-type $Al_xGa_yIn_zN$ crystal film.

The nitride semiconductor layer 214 is, e.g., a 5 µm-thick n-type $Al_xGa_yIn_zN$ crystal film.

The light-emitting layer 215 is composed of, e.g., three layers of multiple quantum well structures and a 10 nm-thick GaN crystal film thereon. Each multiple quantum well structure is composed of an 8 nm-thick GaN crystal film and a 2 nm-thick InGaN crystal film.

The p-GaN layer 216 is, e.g., a 150 nm-thick p-type GaN crystal film.

(Effects of the Second and Third Embodiments)

In the second and third embodiments, the percentage of the surface of the $Ga_2O_3$ substrate covered with the buffer layer in a region immediately below the nitride semiconductor layer (the coverage rate of the buffer layer) is controlled and it is thereby possible to obtain a crystal layered structure in which electrical resistance between the $Ga_2O_3$ substrate and the nitride semiconductor layer is low. In addition, it is possible to obtain a low-voltage driving semiconductor element by using such a crystal layered structure.

EXAMPLE 3

Figure 7A:
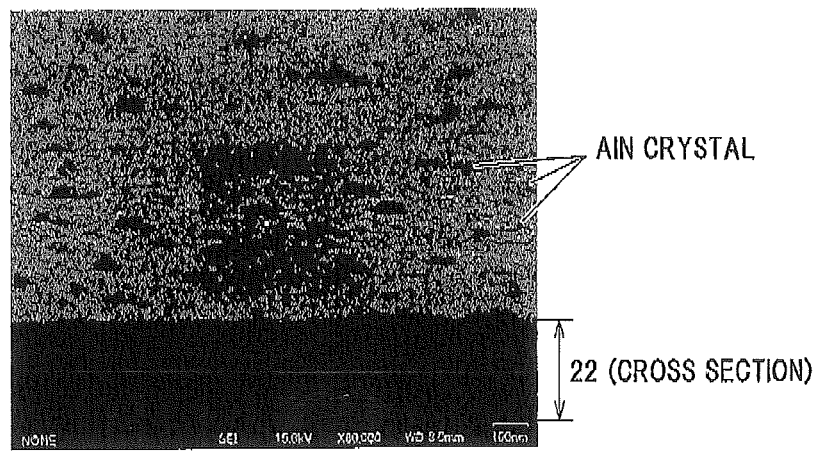
[FIG. 7A]
Figure 7B:
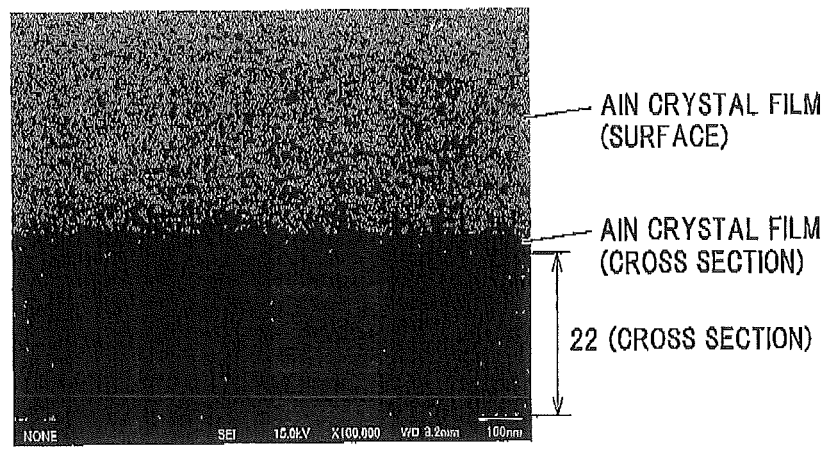
[FIG. 7B]

FIG. 7A and FIG. 7B are SEM (Scanning Electron Microscope) images of buffer layers in Example 3. FIG. 7A and FIG. 7B show AlN crystal layers as the buffer layer 23 each grown on the $Ga_2O_3$ substrate 22 at a growth temperature of 450° C. and then heated to 1050° C.

The AlN crystal layer shown in FIG. 7A is funned of plural AlN crystals which are formed in an island pattern on the $Ga_2O_3$ substrate 22, and the coverage rate thereof is about 35%.

The AlN crystal layer shown in FIG. 7B is formed of an AlN film of which thickness is substantially uniform since more Al and N raw materials than those for the AlN crystal layer shown in FIG. 7A were supplied during growth, and the coverage rate thereof is 100%.

Figure 8:
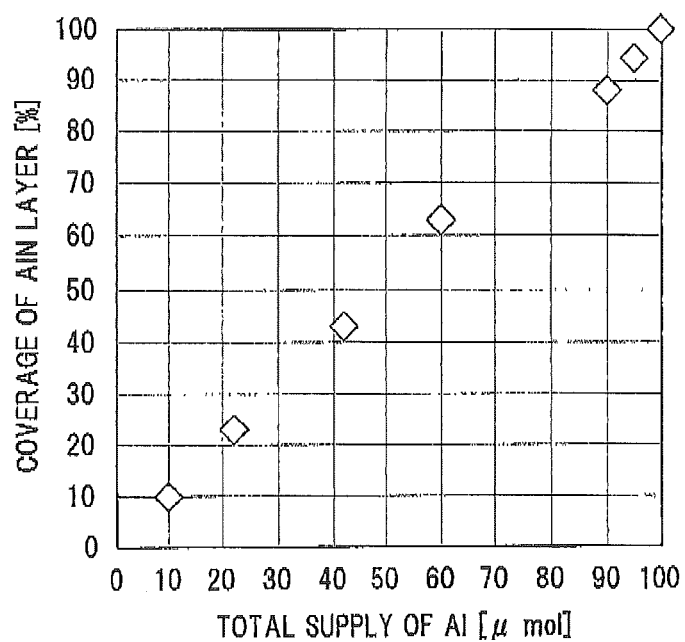
[FIG. 8]

FIG. 8 is a graph showing a relation between the supply quantity of Al raw material to a chamber of a MOCVD system and the coverage rate of an AlN crystal layer as the buffer layer. In FIG. 8, the horizontal axis indicates the total supply [µmol] of the Al raw material (TMA) and the vertical axis indicates the coverage rate [%] of the AlN crystal layer.

As shown in FIG. 8, the coverage rate of the AlN crystal layer increases with increasing the supply quantity of the Al raw material. The increasing rate is different depending on a size of the chamber of the MOCVD system or material efficiency and thus cannot be unambiguously determined, however, an increase in the coverage rate of the AlN crystal layer with increasing the supply quantity of the Al raw material occurs regardless of the environment.

Figure 9:
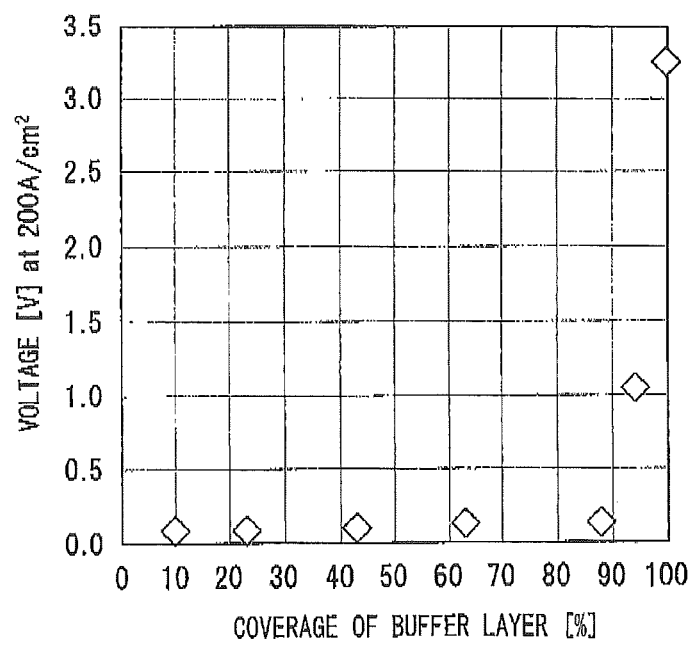
[FIG. 9]

FIG. 9 is a graph showing a relation between the coverage rate of an AlN crystal layer as the buffer layer and voltage between a $Ga_2O_3$ substrate and a GaN crystal layer as a nitride semiconductor layer when a current of a predetermined magnitude flows. In FIG. 9, the horizontal axis indicates the coverage rate [%] of the AlN crystal layer and the vertical axis indicates voltage [V] between the $Ga_2O_3$ substrate and the GaN crystal layer when a current flows through the surface of the GaN crystal layer at a current density of 200 A/cm². Electrodes were respectively connected to the $Ga_2O_3$ substrate and the GaN crystal layer and voltage was then measured.

As shown in FIG. 9, in accordance with an increase in the coverage rate of the AlN crystal layer, voltage begins to increase at around 90% or more of the coverage rate and sharply increases as the coverage rate gets closer to 100%. From this result, it is considered that in the range where the coverage rate is greater than 90%, the electrical resistance between the $Ga_2O_3$ substrate and the GaN crystal layer greatly depends on the contact area between the $Ga_2O_3$ substrate and the GaN crystal layer.

EXAMPLE 4

A predetermined magnitude of current was passed between the p-type electrode 218 and the n-type electrode 219 of the LED element 200 in the third embodiment and voltage was evaluated.

In Example 4, the $Ga_2O_3$ substrate 212 is an n-type β-$Ga_2O_3$ substrate containing Si. In addition, the $Ga_2O_3$ substrate 212 is 400 µm in thickness and has a principal surface oriented in (101).

The buffer layer 213 is a 5 nm-thick AlN crystal film formed at a growth temperature of 450° C. and the coverage rate thereof is 52.3%.

The nitride semiconductor layer 214 is a 5 μm-type GaN crystal film formed at a growth temperature of 1050° C. The nitride semiconductor layer 214 contains Si at a concentration of $1.0\times10^{18}/cm^3$.

The light-emitting layer 215 is composed of three layers of multiple quantum well structures formed at a growth temperature of 750° C. and a 10 nm-thick GaN crystal film thereon. Each multiple quantum well structure is composed of an 8 nm-thick GaN crystal film and a 2 nm-thick InGaN crystal film.

The p-GaN layer 216 is a 150 nm-thick p-type GaN crystal film formed at a growth temperature of 1000° C. The p-GaN layer 216 contains Mg at a concentration of $5.0\times10^{19}/cm^3$.

The contact layer 217 is a 10 nm-thick p-type GaN crystal film formed at a growth temperature of 1000° C. The contact layer 217 contains Mg at a concentration of $1.5\times10^{20}/cm^3$.

Meanwhile, an LED element having an AlN crystal film with the coverage rate of 100% instead of having the buffer layer 213 was prepared as Comparative Example. The quantity of the Al raw material (TMA) supplied bring growth of this AlN crystal film with the coverage rate of 100% is 2.2 times the amount supplied during the growth of the buffer layer 213.

[Evaluation of LED Element]

The LED element 200 and the LED in Comparative Example were respectively mounted on can-type stems using Ag paste, and voltage values when a current of 20 mA was passed between electrodes were measured.

As a result, the voltage value of the LED element 200 was 2.94 V while the voltage value of the LED in Comparative Example was 6.32 V. It was confirmed from this result that the LED element 200 operates at lower voltage than the LED in Comparative Example.

[Fourth Embodiment]

(Configuration of Crystal Layered Structure)

Figure 10:
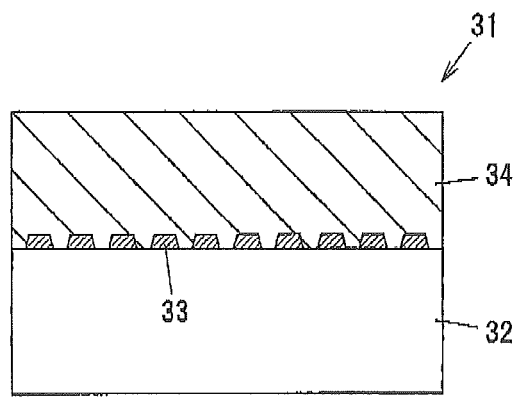
[FIG. 10]

FIG. 10 is a cross sectional view showing a crystal layered structure in the fourth embodiment. A crystal layered structure 31 includes a $Ga_2O_3$ substrate 32, a buffer layer 33 on the $Ga_2O_3$ substrate 32 and a nitride semiconductor layer 34 on the buffer layer 33.

The $Ga_2O_3$ substrate 32 is formed of a $\beta$-$Ga_2O_3$ single crystal. In addition, the principal surface of the $Ga_2O_3$ substrate 32 is preferably a surface having oxygen atoms arranged in a hexagonal lattice pattern, e.g., a (101) plane, a (−201) plane, a (301) plane or a (3-10) plane. In this case, even if the buffer layer 33 is thin (e.g., not more than 10 nm), it is possible to grow a nitride semiconductor crystal having a slat surface on the buffer layer 33 and thereby to form the nitride semiconductor layer 34. (101) is particularly preferable as the principal surface of the $Ga_2O_3$ substrate 32.

The buffer layer 33 is formed of an $Al_xGa_yIn_zN$ ($0 \le x \le 1$, $0 \le y \le 1$, $0 \le z \le 1$, $x+y+z=1$) crystal. A percentage of the surface of the $Ga_2O_3$ substrate 32 covered with the buffer layer 33 in a region immediately below the nitride semiconductor layer 34 is preferably from 10% to 90% in order to reduce electrical resistance between the $Ga_2O_3$ substrate 32 and the nitride semiconductor layer 34, and the buffer layer 33 is formed in, e.g., an island pattern as shown in FIG. 10.

In addition, among the $Al_xGa_yIn_zN$ crystals, an AlN crystal (x=1, y=z=0) is especially preferable to form the buffer layer 33. When the buffer layer 33 is formed of an AlN crystal, adhesion between the $Ga_2O_3$ substrate 32 and the nitride semiconductor layer 34 is further increased. The thickness of the buffer layer 33 is, e.g., 5 nm.

The nitride semiconductor layer 34 is formed of an $Al_xGa_yIn_zN$ ($0 \le x \le 1$, $0 \le y \le 1$, $0 \le z \le 1$, $x+y+z=1$) crystal and is preferably formed of especially a GaN crystal (y=1, x=z=0) having good crystal quality. The thickness of the nitride semiconductor layer 34 is, e.g., 2 μm.

It should be noted that the $Ga_2O_3$ substrate 32 and the nitride semiconductor layer 34 may contain a conductive impurity such as Si.

(Method for Manufacturing Crystal Layered Structure)

Figure 11:
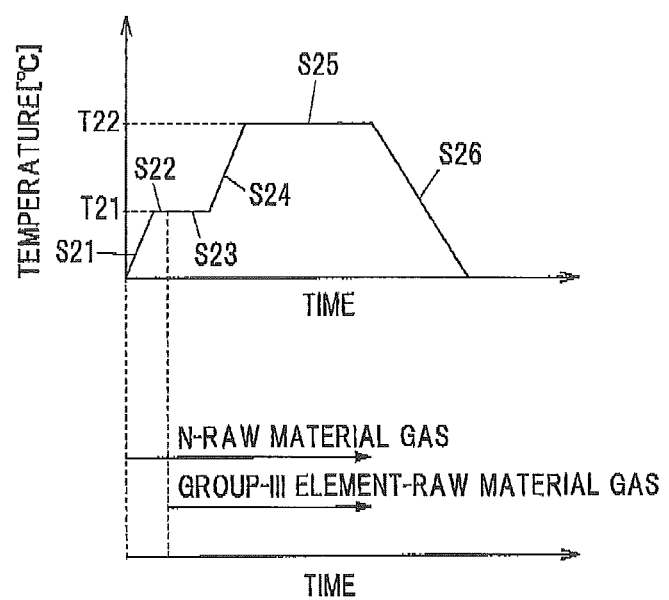
[FIG. 11]
Figure 12:
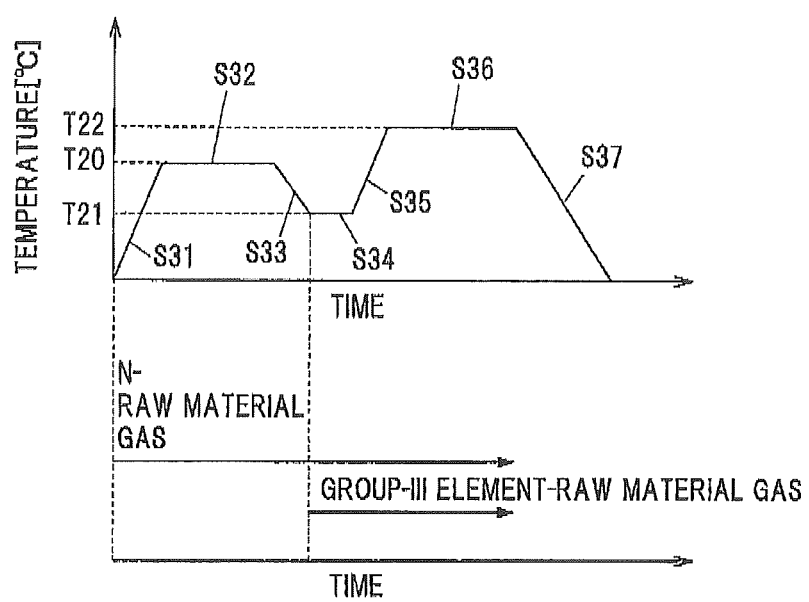
[FIG. 12]

FIG. 11 is a graph showing an example manufacturing process sequence of the crystal layered structure in the present embodiment. FIG. 12 is a graph showing an example manufacturing process sequence of a crystal layered structure in Comparative Example. Polygonal lines on the upper side of the graphs in FIG. 11 and FIG. 12 indicate variation in temperature condition over time, and arrows on the lower side of the graphs in FIG. 11 and FIG. 12 indicate time to supply the raw material gases.

Firstly, an example manufacturing process sequence of the crystal layered structure in the fourth embodiment will be described in reference to FIG. 11. In the manufacturing process sequence of the crystal layered structure in the fourth embodiment, nitriding treatment of the surface of the $Ga_2O_3$ substrate 32 is not performed before forming the buffer layer 33.

Firstly, the $Ga_2O_3$ substrate 32 is subjected to pretreatment for 120 minutes using phosphoric acid of 98 wt % concentration heated to 150° C.

Next, the $Ga_2O_3$ substrate 32 is delivered to a chamber of a MOCVD (Metal Organic Chemical Vapor Deposition) system and temperature in the chamber is then increased to T21 while supplying an N-raw material gas such as $N_2$ or $NH_3$ to the chamber (Step S21). Here, T21 is from 370 to 500° C., e.g., 450° C.

Next, the surface of the $Ga_2O_3$ substrate 32 is exposed to the N-aw material gas for not more than 10 minutes, e.g., for 2 minutes while keeping the temperature in the chamber at T21 (Step S22). The temperature of the $Ga_2O_3$ substrate 32 is stabilized by performing Step S22. When the exposure time of the surface of the $Ga_2O_3$ substrate 32 to the N-raw material gas, i.e., time to perform Step S22, is more than 10 minutes, electrical resistance on the surface of the $Ga_2O_3$ substrate 32 may increase due to excessive nitriding.

Group III element raw material gases, i.e., a Ga raw material gas such as trimethylgallium (TMG) gas, an Al raw material gas such as tri ethyl aluminum (TMA) gas and an In raw material such as trimethylindium (TMI) gas are further fed to the chamber while keeping the temperature M the chamber at T21 to grow an $Al_xGa_yIn_zN$ crystal on the $Ga_2O_3$ substrate 32, thereby forming the buffer layer 33 (Step S23).

Next, the temperature in the chamber is increased to T22 (Step S24). Here, T22 is, e.g., 1050° C.

Next, an $Al_xGa_yIn_zN$ crystal is grown on the buffer layer 33 while keeping the temperature in the chamber at T22, thereby forming the nitride semiconductor layer 34 (Step S25).

After that, the temperature in the chamber is reduced (Step S26) and the crystal layered structure 31 is taken out from the chamber.

Next, an example manufacturing process sequence of the crystal layered structure in Comparative Example will be described in reference to FIG. 12. In the manufacturing process sequence of the crystal layered structure in Comparative Example, nitriding treatment of the surface of the $Ga_2O_3$ substrate 32 is performed before forming the buffer layer 33.

Firstly, the $Ga_2O_3$ substrate 32 is subjected to pretreatment for 120 minutes using phosphoric acid of 98 wt % concentration heated to 150° C.

Next, the $Ga_2O_3$ substrate 32 is delivered to a chamber of a MOCVD (Metal Organic Chemical Vapor Deposition) system and temperature in the chamber is then increased to T20 while supplying an N-raw material gas to the chamber (Step S31). Here, T20 is higher than T21 described above and is, e.g., 800° C.

Next, the temperature in the chamber is kept at T20 and nitriding treatment is performed on the surface of the $Ga_2O_3$ substrate 32 (Step S32).

Next, the temperature in the chamber is reduced to T21 (Step S33). T21 here is the same temperature as T21 shown in FIG. 11.

Next, group III element raw material gases are fed to the chamber while keeping the temperature in the chamber at T21 to grow an $Al_xGa_yIn_zN$ crystal on the $Ga_2O_3$ substrate 32, thereby forming the buffer layer 33 (Step S34).

The subsequent Steps S35 to 37 are the same as the previously mentioned Steps S24 to 26 and the explanation thereof is omitted.

(Effects of the Fourth Embodiment)

In the fourth embodiment, the buffer layer is formed by growing an $Al_xGa_yIn_zN$ crystal on the $Ga_2O_3$ substrate (Step S23) after the $Ga_2O_3$ substrate is kept for not more than 10 minutes in a state of being exposed to nitrogen raw material gas (Step S22), which allows a high-quality nitride semiconductor layer to be formed without performing nitriding treatment on the $Ga_2O_3$ substrate (nitriding treatment at higher temperature than the growth temperature of the $Al_xGa_yIn_zN$ crystal of the buffer layer) before forming the buffer layer.

Since nitriding treatment is not performed, a nitrided portion having high electrical resistance is hardly formed on the surface of the $Ga_2O_3$ substrate and it is thus possible to obtain a crystal layered structure in which electrical resistance between the $Ga_2O_3$ substrate and the nitride semiconductor layer is low. In addition, it is possible to obtain a low-voltage driving semiconductor element by using such a crystal layered structure.

EXAMPLE 5

A predetermined magnitude of current was passed between the $Ga_2O_3$ substrate 32 and the nitride semiconductor layer 34 of the crystal layered structure 31 in the fourth embodiment and voltage was measured.

In the present Example, an AlN layer formed of an AlN crystal was used as the buffer layer 33 and a GaN layer formed of a GaN crystal was used as the nitride semiconductor layer 34.

Five crystal layered structures 31, which were made through a process in which Step S22 in FIG. 11 was performed for 2 minutes (within the limit defined in the fourth embodiment) (hereinafter, referred to as "first crystal layered structure"), and five crystal layered structures 31, which were made through a process in which Step S22 was performed for 30 minutes (out of the limit defined in the fourth embodiment) (hereinafter, referred to as "second crystal layered structure"), were prepared (sample numbers 1 to 5).

Figure 13:
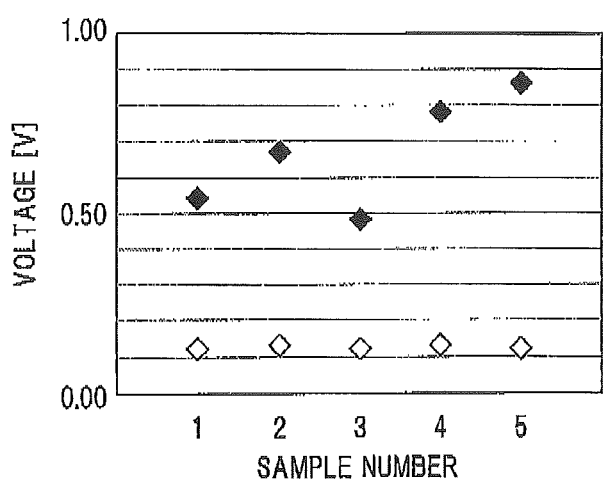
[FIG. 13]

FIG. 13 shows measured values of voltage between the $Ga_2O_3$ substrate and the nitride semiconductor layer when a current of a predetermined magnitude flows through a crystal layered structure. In FIG. 13, the horizontal axis indicates the sample number of the crystal layered structure and the vertical axis indicates voltage [V] between the $Ga_2O_3$ substrate and the nitride semiconductor layer when a current flows through the surface of the nitride semiconductor layer at a current density of 200 A/$cm^2$. In the drawing, open diamonds indicate values measured on the first crystal layered structures and filled diamonds indicate values measured on the second crystal layered structures. Electrodes were respectively connected to the $Ga_2O_3$ substrate and the GaN crystal layer and voltage was then measured.

In the first crystal layered structure, voltage is lower than the second crystal layered structure and variation in voltage between the samples is also small, as shown in FIG. 13. It is considered that this is because the surface of the $Ga_2O_3$ substrate 32 in the first crystal layered structure is not nitrided in Step S22 to the extent that electrical resistance is affected.

Although the embodiments and examples of the invention have been described above, the invention according to claims is not to be limited to the above-mentioned embodiments and examples. Further, it should be noted that all combinations of the features described in the embodiments and examples are not necessary to solve the problem of the invention.

INDUSTRIAL APPLICABILITY

Provided are a crystal layered structure having a low dislocation density on the upper surface of a nitride semiconductor layer on a $Ga_2O_3$ substrate and a method for manufacturing the crystal layered structure.

Also, provided are a crystal layered structure having low electrical resistance between the $Ga_2O_3$ substrate and the nitride semiconductor layer, a method for manufacturing the crystal layered structure and a semiconductor element including the crystal layered structure and driven at low voltage.

In addition, provided is a method for manufacturing a crystal layered structure having low electrical resistance between the $Ga_2O_3$ substrate and the nitride semiconductor layer.

REFERENCE SIGNS LIST 11, 21, 31 crystal layered structure
12, 22, 32, 112, 212 $Ga_2O_3$ substrate
13, 23, 33, 113, 213 buffer layer
14, 24, 34, 214 nitride semiconductor layer
14a high oxygen concentration layer
14b low oxygen concentration layer
100, 200 LED element

The invention claimed is:

1. A crystal layered structure, comprising:
   a $Ga_2O_3$ substrate;
   a buffer layer comprising an $Al_xGa_yIn_zN$ ($0 \leq x \leq 1$, $0 \leq y \leq 1$, $0 \leq z \leq 1$, $x+y+z=1$) crystal on the $Ga_2O_3$ substrate; and
   a nitride semiconductor layer comprising an $Al_xGa_yIn_zN$ ($0 \leq x \leq 1$, $0 \leq y \leq 1$, $0 \leq z \leq 1$, $x+y+z=1$) crystal containing oxygen as an impurity on the buffer layer,
   wherein an oxygen concentration in a region on a side of the $Ga_2O_3$ substrate of the nitride semiconductor layer, region having a thickness of not less than 200 nm, is not less than $1.0 \times 10^{18}$/$cm^3$.

2. The crystal layered structure according to claim 1, wherein the nitride semiconductor layer has a dislocation density of less than $1.0 \times 10^9$/$cm^2$ on a surface thereof opposite the $Ga_2O_3$ substrate.

3. The crystal layered structure according to claim 1, wherein an oxygen concentration in a region on the side of the $Ga_2O_3$ substrate of the nitride semiconductor layer, the region having a thickness of not less than 500 nm, is not less than $1.0 \times 10^{18}$/$cm^3$.

4. The crystal layered structure according to claim 1, wherein the oxygen concentration in the region is not less than $5.0 \times 10^{18}$/$cm^3$.

5. The crystal layered structure according to claim 1, wherein the $Al_xGa_yIn_zN$ crystal of the buffer layer comprises an AlN crystal.

6. The crystal layered structure according to claim 1, wherein the $Al_xGa_yIn_zN$ crystal of the nitride semiconductor layer comprises a GaN crystal.

7. A method for manufacturing a crystal layered structure, comprising:
   a step of forming a buffer layer by growing a first $Al_xGa_yIn_zN$ ($0 \leq x \leq 1$, $0 \leq y \leq 1$, $0 \leq z \leq 1$, $x+y+z=1$) crystal on a $Ga_2O_3$ substrate; and
   a step of forming a nitride semiconductor layer by growing a second $Al_xGa_yIn_zN$ ($0 \leq x \leq 1$, $0 \leq y \leq 1$, $0 \leq z \leq 1$, $x+y+z=1$) crystal on the buffer layer,
   wherein the second $Al_xGa_yIn_zN$ crystal is initially grown at a first temperature of not more than 1000° C. and is then grown at a second temperature higher than the first temperature in the step of forming the nitride semiconductor layer, and
   wherein the second $Al_xGa_yIn_zN$ crystal grown at the first temperature is not less than 200 nm in thickness.

8. The method for manufacturing a crystal layered structure according to claim 7, wherein the second $Al_xGa_yIn_zN$ crystal grown at the first temperature is not less than 500 nm in thickness.

9. The method for manufacturing a crystal layered structure according to claim 7, wherein the first $Al_xGa_yIn_zN$ crystal comprises an AlN crystal.

10. The method for manufacturing a crystal layered structure according to claim 7, wherein the second $Al_xGa_yIn_zN$ crystal comprises a GaN crystal.

11. A crystal layered structure, comprising:
    a $Ga_2O_3$ substrate;
    a buffer layer comprising an $Al_xGa_yIn_zN$ ($0 \leq x \leq 1$, $0 \leq y \leq 1$, $0 \leq z \leq 1$, $x+y+z=1$) crystal on the $Ga_2O_3$ substrate; and
    a nitride semiconductor layer comprising an $Al_xGa_yIn_zN$ ($0 \leq x \leq 1$, $0 \leq y \leq 1$, $0 \leq z \leq 1$, $x+y+z=1$) crystal on the buffer layer,
    wherein a percentage of a surface of the $Ga_2O_3$ substrate covered with the buffer layer in a region immediately below the nitride semiconductor layer is not less than 10% and less than 100%, and
    wherein a portion of the nitride semiconductor layer is in contact with the surface of the $Ga_2O_3$ substrate.

12. The crystal layered structure according to claim 11, wherein the percentage is not more than 90%.

13. The crystal layered structure according to claim 11, wherein the buffer layer comprises the $Al_xGa_yIn_zN$ crystal arranged in an island pattern on the $Ga_2O_3$ substrate.

14. The crystal layered structure according to claim 11, wherein the buffer layer comprises the $Al_xGa_yIn_zN$ crystal in a film shape comprising a hole.

15. The crystal layered structure according to claim 11, wherein the $Al_xGa_yIn_zN$ crystal of the buffer layer comprises an AlN crystal.

16. The crystal layered structure according to claim 11, wherein the $Al_xGa_yIn_zN$ crystal of the nitride semiconductor layer comprises a GaN crystal.

17. A semiconductor element, comprising:
    the crystal layered structure according to claim 11,
    wherein the $Ga_2O_3$ substrate and the nitride semiconductor layer are configured to allow electrical conduction therethrough.

18. A method for manufacturing a crystal layered structure, comprising:
    a step of forming a buffer layer by growing a first $Al_xGa_yIn_zN$ ($0 \leq x \leq 1$, $0 \leq y \leq 1$, $0 \leq z \leq 1$, $x+y+z=1$) crystal on a $Ga_2O_3$ substrate so as to partially cover a surface of the $Ga_2O_3$ substrate; and
    a step of foaming a nitride semiconductor layer by growing a second $Al_xGa_yIn_zN$ ($0 \leq x \leq 1$, $0 \leq y \leq 1$, $0 \leq z \leq 1$, $x+y+z=1$) crystal on the buffer layer,
    wherein a percentage of a surface of the $Ga_2O_3$ substrate covered with the buffer layer in a region immediately below the nitride semiconductor layer is not less than 10% and less than 100%, and
    wherein a portion of the nitride semiconductor layer is in contact with the surface of the $Ga_2O_3$ substrate.

19. The method for manufacturing a crystal layered structure according to claim 18, wherein the percentage is not more than 90%.

20. The method for manufacturing a crystal layered structure according to claim 18, wherein the buffer layer is formed by growing the first $Al_xGa_yIn_zN$ crystal in an island pattern on the $Ga_2O_3$ substrate.

21. The method for manufacturing a crystal layered structure according to claim 18, wherein the buffer layer is formed by growing the first $Al_xGa_yIn_zN$ crystal in a film shape comprising a hole on the $Ga_2O_3$ substrate.

22. The method for manufacturing a crystal layered structure according to claim 18, wherein the first $Al_xGa_yIn_zN$ crystal comprises an AlN crystal.

23. The method for manufacturing a crystal layered structure according to claim 18, wherein the second $Al_xGa_yIn_zN$ crystal comprises a GaN crystal.

24. A method for manufacturing a crystal layered structure, comprising:
    a step of forming a buffer layer by growing a first $Al_xGa_yIn_zN$ ($0 \leq x \leq 1$, $0 \leq y \leq 1$, $0 \leq z \leq 1$, $x+y+z=1$) crystal at a first temperature on a $Ga_2O_3$ substrate of which principal surface is a surface having an oxygen atom arranged in a hexagonal lattice pattern; and
    a step of farming a nitride semiconductor layer by growing a second $Al_xGa_yIn_zN$ ($0 \leq x \leq 1$, $0 \leq y \leq 1$, $0 \leq z \leq 1$, $x+y+z=1$) crystal on the buffer layer,
    wherein a step of nitriding a surface of the $Ga_2O_3$ substrate at a higher temperature than the first temperature is not performed before forming the buffer layer.

25. The method for manufacturing a crystal layered structure according to claim 24, wherein the $Ga_2O_3$ substrate is kept at the first temperature for not more than 10 minutes in a state of being exposed to a nitrogen raw material gas and is then kept at the first temperature in a state of being exposed to the N-raw material gas and an Al raw material gas to grow the second $Al_xGa_yIn_zN$ crystal.

26. The method for manufacturing a crystal layered structure according to claim 24, wherein the principal surface of the $Ga_2O_3$ substrate comprises one of (101), (−201), (301) and (3-10) planes.

27. The method for manufacturing a crystal layered structure according to claim 24, wherein the first $Al_xGa_yIn_zN$ crystal comprises an AlN crystal.

28. The method for manufacturing a crystal layered structure according to claim 24, wherein the second $Al_xGa_yIn_zN$ crystal comprises a GaN crystal.

* * * * *